US005912550A

United States Patent [19]

Sharpe-Geisler

[11] Patent Number: 5,912,550

[45] Date of Patent: Jun. 15, 1999

[54] POWER CONVERTER WITH 2.5 VOLT SEMICONDUCTOR PROCESS COMPONENTS

[75] Inventor: Bradley A. Sharpe-Geisler, San Jose, Calif.

[73] Assignee: Vantis Corporation, Sunnyvale, Calif.

[21] Appl. No.: 09/196,080

[22] Filed: Nov. 19, 1998

Related U.S. Application Data

[60] Provisional application No. 60/079,705, Mar. 27, 1998.

[51] Int. Cl.[6] .......... G05F 1/56

[52] U.S. Cl. .......... 323/273

[58] Field of Search .......... 323/265, 273, 323/281, 282, 312, 313, 314, 315, 351; 327/539

[56] References Cited

U.S. PATENT DOCUMENTS

| | | | |
|---|---|---|---|
| 3,959,713 | 5/1976 | Davis et al. | 323/278 |
| 4,317,054 | 2/1982 | Caruso et al. | 307/297 |
| 4,346,342 | 8/1982 | Carollo | 323/276 |
| 4,588,941 | 5/1986 | Kerth et al. | 323/314 |
| 4,595,874 | 6/1986 | Hein et al. | 323/312 |
| 5,182,526 | 1/1993 | Nelson | 330/257 |
| 5,479,172 | 12/1995 | Smith et al. | 342/51 |
| 5,796,244 | 8/1998 | Chen et al. | 323/313 |

*Primary Examiner*—Adolf Deneke Berhane
*Attorney, Agent, or Firm*—Fliesler, Dubb, Meyer & Lovejoy

[57] ABSTRACT

A power converter provides a voltage reference (Vdd) to a plurality of transistors on an integrated circuit with a limited voltage swing when a load is connected and removed. The power converter includes an opamp (100) having an input (+) receiving a voltage reference ($V_{DIOD}$), an input (−) connected to a resistor divider (102, 104) and an output driving the gate of a transistor (110). The transistor (110) has a source to drain path providing a 3.3 volt supply (NV3EXT) to an output node (n2) which supplies Vdd. The output node (n2) is connected back to the resistor divider (102,104) and to the source of a cascode transistor (300). The cascode (300) is connected with cascode (302) to form a current mirror which is interconnected with transistor (304) and capacitor (306) to slow the response at node (n7) to transitions at the output node (n2). Cascode (300) drives a current mirror (314, 316). The operational amplifier (100) functions to control the gate voltage of transistor (110) to maintain the voltage Vdd at a constant value. With significant loading to the output, after the loading is removed, cascode (300) will turn on to cause transistor (316) to limit the voltage swing of Vdd until opamp (100) can return Vdd to a constant value.

17 Claims, 4 Drawing Sheets

POWER CONVERTER WITH 2.5 VOLT SEMICONDUCTOR PROCESS COMPONENTS

CROSS-REFERENCE TO RELATED APPLICATION

This application claims the benefit of U.S. provisional application No. 60/079,705, filed Mar. 27, 1998.

BACKGROUND OF THE INVENTION

1. Field of the Invention

The present invention relates to a power converter used for providing a stable voltage supply to a plurality of transistors on an integrated circuit.

2. Description of the Related Art

FIG. 1 shows a typical circuit for a power converter for providing a voltage Vdd of 2.5 volts to components on an integrated circuit chip made using a 2.5 volt process. CMOS transistors made using such a 2.5 volt process typically have a limit of 2.7 volts for a gate to drain, or gate to source voltage before damage to the transistor gate oxide occurs.

The circuit of FIG. 1 includes an operational amplifier (opamp) 100 which has a noninverting input (+) connected to a diode voltage reference ($V_{DIOD}$) , typically 1.2 volts, and an inverting input (–) connected to a resistor divider made up of resistors 102 and 104. Power is provided to the opamp from an external supply pin (NV3EXT) providing a voltage in the range of 3.0 to 3.6 volts. The output of the opamp 100 then drives the gate of an NMOS transistor 110.

The voltage $V_{DIOD}$ can be provided from a conventional voltage reference, such as a band gap reference. Such a reference circuit included with the power converter of FIG. 1 forms a voltage regulator.

The transistor 110 has a drain connected to the NV3EXT supply and a source providing the supply voltage Vdd. The supply voltage Vdd is divided by the resistor divider 102, 104 so that the voltage at node n1 matches the diode reference voltage $V_{DIOD}$. Transistor 110 is a large device, and is connected to subsequent components in a source follower configuration. The large transistor 110 experiences a more significant change in its drain to source current (Ids) with a change in gate voltage than a smaller device.

In operation, when a load is placed on the node n2, which pulls down Vdd, the inverting (–) input of the opamp 100 will drop, and the opamp 100 output voltage will increase and turn on transistor 110 to provide more current to node n2 to raise Vdd back to the desired level.

A large capacitor 112 is connected to the gate of transistor 110 to decouple the gate of transistor 110 from its source. With a significant drop in the source voltage of transistor 110, without capacitor 112, the gate will tend to be pulled down with the source until the opamp 100 has had time to increase the gate voltage to pull the source of transistor 110 back up. The capacitor 112 limits the speed that the gate of transistor 110 can be pulled down and provides stability to the circuit of FIG. 1.

FIG. 2 illustrates how the voltage Vdd at node n2 and the drain to source current of transistor 110 are affected when a load is placed on node n2. Initially the load is assumed to draw 5 milliamps, and the voltage Vdd remains stable at 2.5 volts. When the load is applied to node n2 which is assumed to draw 500 ma, the current Ids of transistor 110 immediately increases to provide the 500 milliamps, and the voltage Vdd initially reduces to approximately 2.2 volts before the opamp 100 can react to increase the gate voltage to transistor 110. Once the opamp 100 increases the gate voltage to transistor 110, the voltage Vdd increases back from 2.2 volts to 2.5 volts. Similarly, when the 500 ma load is removed, the current Ids will immediately return to 5 ma, but the gate voltage on transistor 110 will not be reduced for a short period of time by the opamp 100 so the voltage Vdd initially increases to approximately 2.8 volts. Once the opamp 100 decreases the gate voltage to transistor 110, the voltage Vdd decreases back from 2.8 volts to 2.5 volts.

As can be seen from FIG. 2, with the configuration of the circuit of FIG. 1, the voltage Vdd provided by a typical 2.5 volt power converter may increase slightly above the maximum of 2.7 volts between the source and drain, drain and gate, or source and gate for transistors made using a 2.5 volt technology. With a 2.5 volt process, transistor oxide thicknesses are typically set such that the maximum gate to drain, or gate to source voltage for a transistor cannot exceed 2.7 volts without damaging the gate oxide.

SUMMARY OF THE INVENTION

The present invention provides additional circuitry with the power converter of FIG. 1 to further limit output voltage swing so that output loading does not cause the output voltage to exceed 2.7 volts.

The present invention includes a first cascode connected transistor having a source coupled to the output node n2 of the circuit of FIG. 2. A cascode transistor is defined as being turned on and off by varying source voltage with gate voltage fixed, rather than varying gate voltage. The first cascode transistor has a drain driving one leg of a first current mirror. A second leg of the first current mirror connects the output node n2 to ground. In operation, after the loading is removed from output node n2, the first cascode transistor will turn on to cause the second leg of the first current mirror to pull down node n2 to limit the voltage swing of Vdd until the opamp 100 can return Vdd to a constant value. Gain provided by the first cascode and first current mirror enables significant current to be withdrawn, preventing the node n2 voltage swing from exceeding 2.7 volts.

The present invention can further include a second cascode connected in a current mirror configuration with the first cascode. The second cascode, thus, has a source connected to node n2, and a gate connected to the gate of the first cascode transistor. A depletion mode transistor and capacitor are then connected with the second cascode transistor. The depletion mode transistor has a source to drain path connecting the drain of the second cascode transistor to its gate, and a gate tied to node n2. The capacitor ties the gate of the second cascode to ground. In operation, the depletion mode transistor and capacitor provide an RC time delay to slow the response of the cascode transistors to changes at node n2.

The present invention can further include weak current sinks coupled to the drains of the first and second cascode transistors to prevent the second leg of the first current mirror from withdrawing current from node n2 during steady state conditions.

A transistor may further be connected between the drain of the first cascode and the first leg of the first current mirror with a gate tied to the output of the opamp. Such a transistor will normally be on, but will turn off when a very low voltage is provided on the output of the opamp to provide over voltage protection.

BRIEF DESCRIPTION OF THE DRAWINGS

Further details of the present invention are explained with the help of the attached drawings in which.

DETAILED DESCRIPTION

Figure 1:
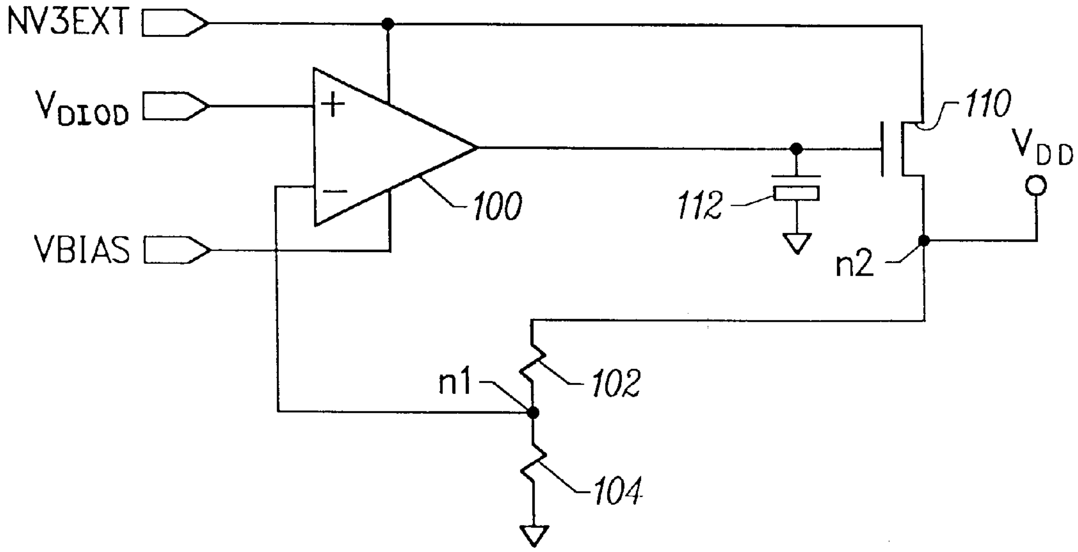
FIG. 1 PRIOR ART
FIG. 1 shows components of a prior art power converter.
Figure 2:
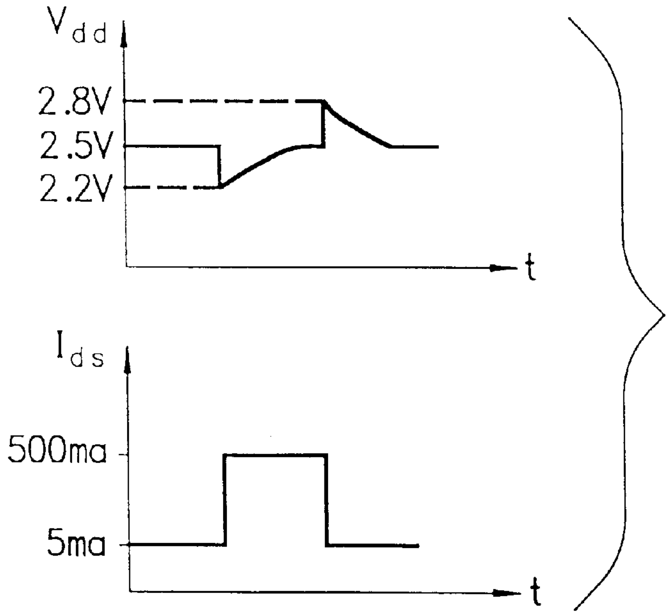
FIG. 2 plots voltage Vdd at node n2 vs. time and Ids of transistor 110 vs. time for the circuit of FIG. 1 when a load is applied and removed from node n2.
Figure 3:
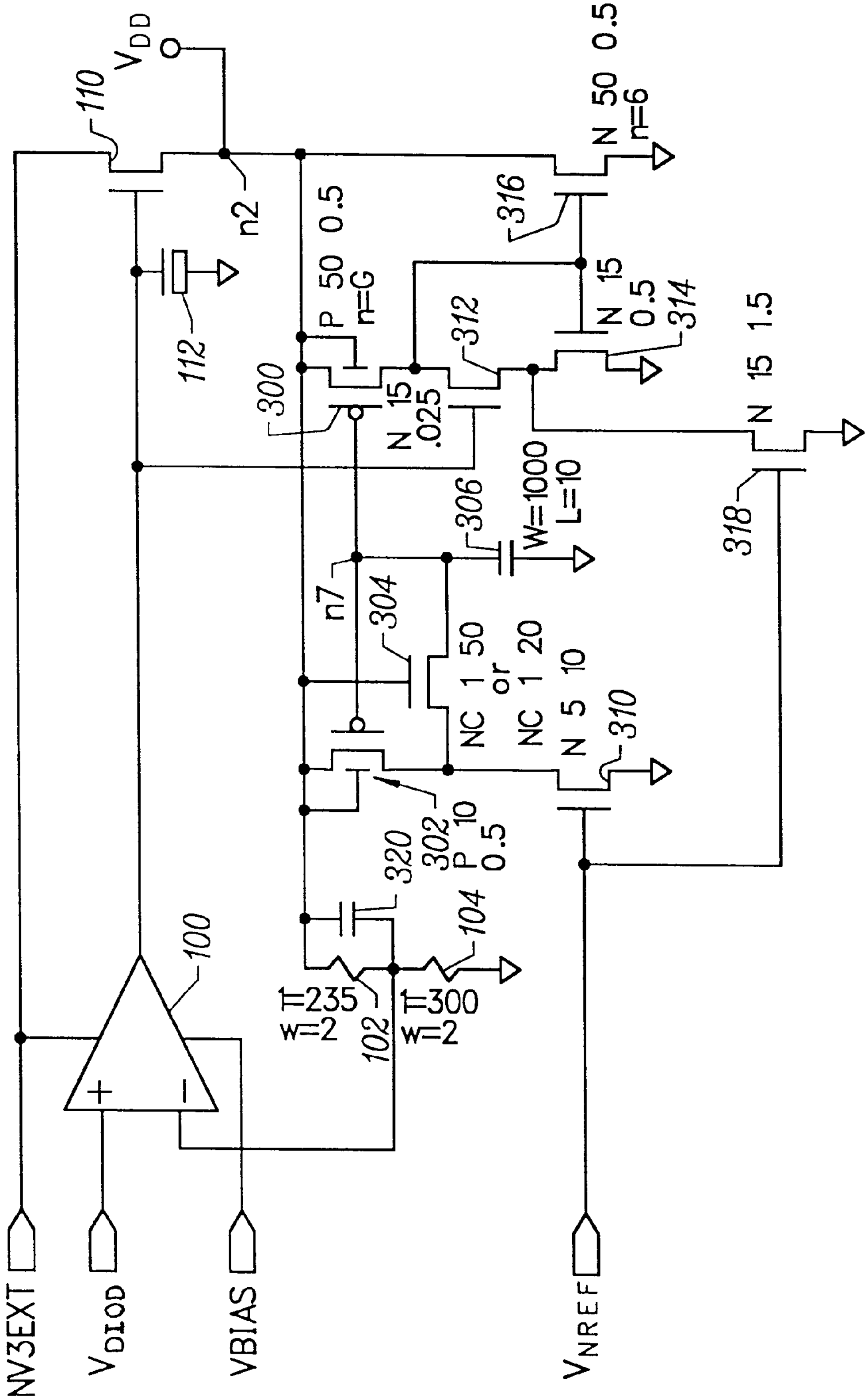
FIG. 3 shows components of a power converter of the present invention.

FIG. 3 shows circuitry added to the power converter of FIG. 1 to provide the power converter of the present invention with a more limited swing in Vdd. Components carried over from FIG. 1 to FIG. 3 have the same reference numbers.

FIG. 3 includes a PMOS cascode transistor 300. A cascode transistor is a transistor defined by being turned on and off by varying voltage applied to the source with the gate voltage substantially fixed, rather than varying the gate voltage. In a PMOS cascode transistor with $(v_s-v_g)>v_t$, wherein $v_g$ is the gate voltage, $v_s$ is the source voltage, and $v_t$ is the threshold voltage of the transistor, the cascode transistor will turn on and increase current depending on the amount $v_s-v_g$ exceeds $v_t$. With $(v_s-v_g)<v_t$, the cascode transistor will turn off.

With transistor 300 being a cascode connected device, if node n2 is pulled up when a load is removed from the node n2, transistor 300 turns on to sink current from node n2. Cascode 300, thus, serves to limit how high the voltage Vdd can go when a load is removed from node n2.

Transistor 310 has a gate driven by a current reference voltage $V_{NREF}$ which turns on transistor 310 to provide a small amount of current, such as 1 microamp. Transistors 300 and 302 form a current mirror. The gates of transistors 300 and 302 are connected together. The drain of transistor 302 is coupled to its gate and to the gate of transistor 300 at a node n7 by transistor 304. Transistor 304, along with capacitor 306 puts in a RC time constant so that the current mirror 300,302 responds slowly.

For the transistors shown in FIG. 3, and in subsequent drawings, a suggested channel type and transistor dimensions are indicated next to the transistor with a p or n indicating channel type followed by channel width and length in microns. An indication (m=6, m=2, m=3) after the channel length indicates that a number of transistors are connected in parallel to effectively form a single larger transistor. For resistors and capacitors, a suggested width and length are likewise shown. Transistor sizes and types are only suggested and may be changed to meet particular design requirements.

The value "NC" associated with transistor 304 (and although not shown also preferably included with transistor 110) indicates the transistor is a depletion mode device. The transistor 304 is made a depletion mode device by adding additional n type implantation in its channel, such as by implanting phosphorous, to create a high resistance from its source to drain. The transistor 110 is also preferably a depletion mode device to assure NV3EXT is adequate to provide Vdd. With transistor 110 being an enhancement device, the source voltage of 2.5 volts plus an NMOS threshold voltage of approximately 0.7 volts must be applied to its gate to turn it on, totaling 3.3 volts. With the gate voltage on transistor 110 being 3.3 volts, a gate to source voltage greater than 2.7 volts can result to damage capacitor 112 which is a 2.5 volt process device.

Transistor 300 is made up of six transistors (m=6) each with a channel width of 50 microns, while transistor 302 has a 10 micron channel width, indicating that transistor 300 is essentially 30 times larger. With such channel widths, transistor 300 will sink 30 times more current than transistor 302. If node n2 rises above a steady state value of 2.5 volts for Vdd, transistor 300 will sink a lot more current than transistor 302.

Transistors 314 and 316 form a current mirror. Transistor 300 is connected by a source to drain path of transistor 314 to the drain of NMOS transistor 314. Transistor 316 is 20 times larger than transistor 314. When node n2 goes above steady state, transistors 300, 302 and 316 turn on, and transistor 316 sources 600 times (30×20=600) more current than transistor 302. Transistor 316, thus, functions to significantly limit the amount node n2 is pulled up in voltage when a load is removed, and can respond more rapidly than the opamp 100 without transistor 300 connected in a cascode configuration to node n2 and high gain provided to the gate of transistor 316. High gain results from gain through the cascode transistor 300 and the gain through the current mirror since transistor 316 is 20 times larger than transistor 314.

Transistor 312 has a source and drain separating the cascode 300 and transistor 314 of the current mirror, and has a gate connected to the output of the opamp 100. Transistor 312 is normally on, but serves to turn off when a very low voltage is provided on the output of the opamp 100 to provide over voltage protection. Transistor 314 which can only sink a minimal amount of current. With transistor 312 off, the voltage at the drain of transistor 300 will increase to turn on transistor 316 even more strongly to rapidly discharge node n2. If a steady state external source is applied to n2 transistor 316 will regulate (or clump) to 25 V.

Transistors 310 and 318 are used to control quiescent current so limited power is drawn when Vdd is stable. Transistors 310 and 318 have a gate voltage $V_{NRFF}$ set so they are turned on to a limited degree. Transistor 318 removes current which would be drawn by transistor 314 so that transistor 316 doesn't mirror such a current during steady state conditions. Transistor 310 controls the current through transistor 302 so that the gate of cascode transistor 300 is biased to give a low steady state current.

Figure 4:
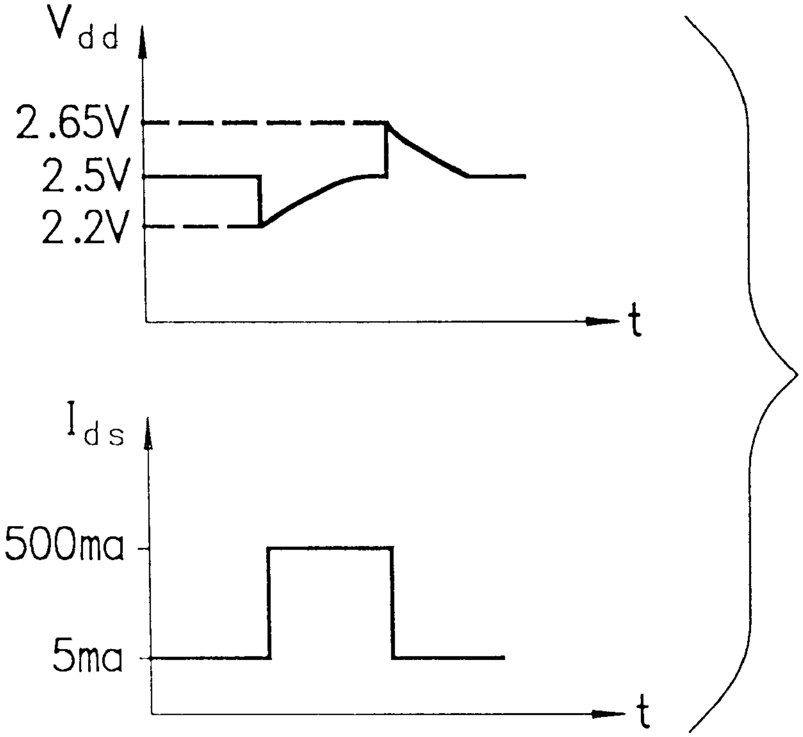
FIG. 4 plots voltage Vdd at node n2 vs. time and Ids of transistor 110 vs. time for the circuit of FIG. 3 when a load is applied and removed from node n2.

FIG. 4 illustrates how the voltage Vdd at node n2 and the drain to source current of transistor 110 are affected when a load is placed on node n2 when the circuitry of FIG. 3 is utilized. Initially the load is assumed to draw 5 milliamps, and the voltage Vdd remains stable at 2.5 volts. When the load is applied to node n2 which draws 500 ma, the current Ids of transistor 110 immediately increases to provide the 500 milliamps, and the voltage Vdd initially reduces to approximately 2.3 volts before the opamp 100 can react to increase Vdd back to 2.5 volts, similar to FIG. 2. When the 500 ma load is removed, the current Ids will return to 5 ma and the voltage Vdd will initially rise, but to a more limited degree with the circuitry of FIG. 3 (illustrated here as 2.65 volts as opposed to 2.8 volts in FIG. 2).

The present invention further includes a capacitor 320 connected from node n2 to the inverting input of the opamp 100 in parallel with resistor 102. The capacitor 320 provides a phase lead relative to the signal at node n2 to the inverting input of the opamp 100 to keep loop gain below 1 and avoid oscillations. The capacitor 320 also provides an immediate change at the inverting input of the opamp 100 when the node n2 voltage changes, enabling the opamp 100 to more quickly respond than a circuit with resistor 102 without such a capacitor.

To manufacture a circuit containing the resistor 102 and capacitor 320, the resistor 102 is formed by providing a p+diffusion region in a n type well. To create the capacitor, the n type well in which the resistor 102 is formed is simply tied to node n2.

Figure 5:
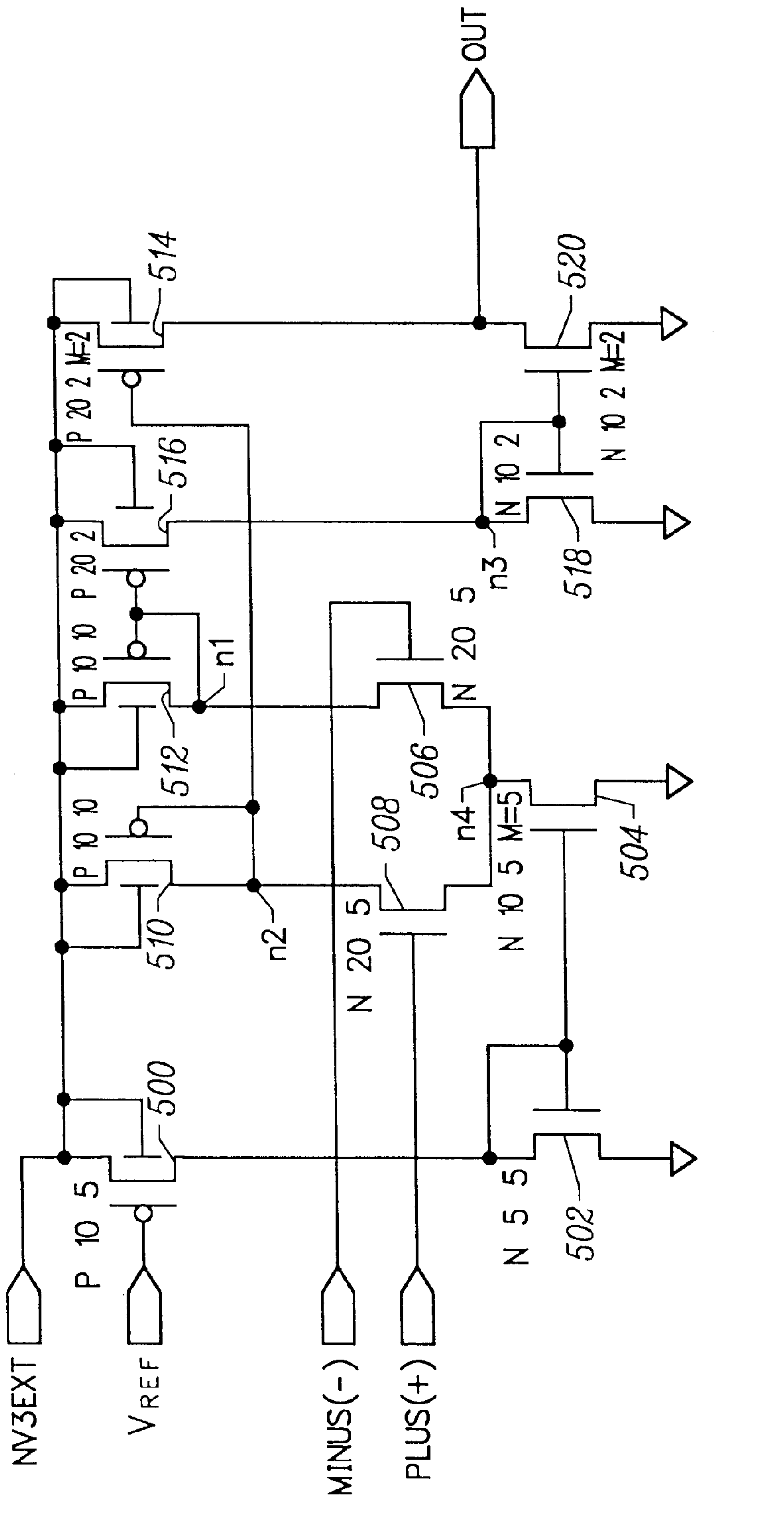
FIG. 5 shows circuitry for an opamp 100 of FIG. 3 as configured to use 2.5 volt semiconductor process transistors.

FIG. 5 shows circuitry for an opamp 100 of FIG. 3 as configured to use 2.5 volt semiconductor process transistors. The voltage $V_{PREF}$. received by the opamp is set to the threshold voltage of a PMOS transistor (1Vtp≈0.6V) below NV3EXT.

PMOS transistor 500 of the opamp has a source tied to NV3EXT, and a gate connected to $V_{PREF}$. Transistor 500 will, thus, be a weak current source with NV3EXT and $V_{PREF}$. having voltage values as described above. NMOS Transistor 502 has drain and gate connected to the drain of transistor 500, and a source connected to ground. Transistor 502 will sink the same current as transistor 500 and will likewise be weakly turned on with a 1 Vtn gate voltage.

Transistor 504 has a gate connected to the gate of transistor 502. Transistor 504 will, thus, mirror the current drawn by transistor 502, but transistor 504 is 20 times larger and will draw 20 times more current (m=5 indicates 5 transistor with a width of 10 microns for transistor 504, while transistor 502 has an 5 micron width).

NMOS transistors 506 and 508 have gates receiving the differential input for the opamp. Transistor 506 receives the inverting (−) input, and transistor 508 receives the noninverting (+) input. Transistors 506 and 506 have sources connected to the drain of transistor 504.

Transistor 510 has a gate and drain connected to the drain of transistor 508, so transistor 510 is biased by current from transistor 508. For example, if transistor 508 is drawing 10 microamps, transistor 510 which has a source connected to NV3EXT will source 10 microamps. Similarly, transistor 512 has a gate and drain connected to the drain of transistor 506, and a source connected to NV3EXT, so transistor 512 will source the same current which transistor 506 sinks.

In operation, we first assume that the noninverting (+) input of the opamp in FIG. 5 is higher than the inverting (−) input. Node n4 will go to the threshold of an NMOS transistor (1 Vtn) below the +input and all current to transistor 504 will be provided by transistor 508. Transistor 506 will turn off. Similarly, if the −input is above the +input, transistor 508 will be off and transistor 506 will conduct to pull node n4 1 Vtn below the −input. For example, if the +input is 2.2 volts and the −input is 2.0 volts, transistor 508 will turn on to pull node n4 to 2.2 volts minus 1 Vtn and transistor 506 will be turned off. If the −input is 2.2 volts, and +input is 2.0 volts, transistor 506 will turn on to pull node n4 to 2.2 volts minus 1 Vtn and transistor 508 will turn off.

Transistor 514 has a gate connected to the gate of transistor 510 and a source connected to NV3EXT to form a current mirror. Similarly, transistor 516 has a gate connected to the gate of transistor 512 and a source connected to NV3EXT to form another current mirror. An additional current mirror is formed by transistors 518 and 520 which have gates connected together. Transistor 518 further has its gate and drain connected to the drain of transistor 516. The drain of transistor 520 is connected to the drain of transistor 514 to form the output (OUT) of the opamp. Sources of transistors 518 and 520 are connected to ground.

Assuming that the +input is above the −input, transistor 508 will be on and transistor 504 will sink current from transistor 510, while transistor 506 is off and transistor 512 has no path to ground. With no current through transistor 512, transistor 516 which mirrors the current of transistor 512, will provide no current. Since transistor 518 sinks the current transistor 516 sources, transistor 518 will carry no current. Since transistor 520 mirrors the current transistor 518 sinks, transistor 520 will sink no current. A path to ground from the output (OUT) will, thus, be cut off. With transistor 514 mirroring the current of transistor 510 and transistor 520 turned off, the output (OUT) will be pulled up to NV3EXT. Transistor 514 is sized approximately 40 times larger than transistor 510, so significant gain will be provided to assure the output (OUT) is high.

Similarly, if the −input is above the +input, transistor 506 will be on and transistor 504 will sink current from transistor 512, while transistor 508 will be off along with transistor 510. With transistor 510 off, transistor 514 will not source current to the output (OUT). With transistor 512 on, transistor 516 mirroring current from transistor 512, transistor 518 sinking the current sourced by transistor 512, and transistor 520 mirroring the current of transistor 518, transistor 520 will pull the output (OUT) to ground. Transistor 520 is significantly larger than transistor 518 and will sink a significant amount of current when transistor 518 is turned on to assure the output (OUT) is pulled down.

In summary, a small difference between the −input and the +input will cause a switching of the voltage on the output (OUT). If the −input and the +input are substantially equal, then the output (OUT) will be theoretically balanced.

The circuit of FIG. 1 is configured so that with 2.5 volt semiconductor process transistors, Vgs, Vgd and Vds for the opamp transistors will not exceed a maximum of 2.7 volts. The voltage applied to the +and −inputs will preferably be 1.2 volts, and node n4 will be 1 Vtn below this or around 0.6 volts. Node n2 will be NV3EXT-1 Vtp since transistor 510 has its drain and gate connected together. With NV3EXT being a maximum of 3.6 volts, node n2 will be around 3.0 volts. With node n4 being around 0.6 volts, a maximum of 2.4 volts will be applied across transistors 506 and 508. Node n3 is 1 Vtn since transistor 518 has its gate and drain connected. The gate of transistor 516 being tied to the gate of transistor 512 will also be 1 Vtp below NV3EXT. The highest gate stress of transistor 516 will then be NV3EXT−1 Vtn−1 Vtp, or around 2.4 volts. The same conditions exist for transistor 514.

If the PMOS transistors and NMOS transistors in the circuit of FIG. 1 are swapped, an opamp will still be formed, but circumstances will exist where the gate oxide will see greater than 2.7 volts, which is an undesirable condition for 2.5 volt semiconductor devices.

Although the present invention has been described above with particularity, this was merely to teach one of ordinary skill in the art how to make and use the invention. Many additional modifications will fall within the scope of the invention, as that scope is defined by the claims which follow.

What is claimed is:

1. A power converter comprising:

an operational amplifier having a first input for receiving a voltage reference, a second input and an output;

a first transistor having a source to drain path coupling a first voltage potential terminal to an output node, and having a gate coupled to the output of the operational amplifier;

a resistor divider comprising a first resistor coupling the output node to the second input of the operational amplifier, and a second resistor coupling the second input of the operational amplifier to a second voltage potential terminal; and a first cascode transistor having a source coupled to the output node, and a drain coupled to the second voltage potential terminal.

2. The power converter of claim 1, further comprising a first current mirror comprising:

a second transistor having a source to drain path coupling the drain of the first cascode transistor to the second voltage potential terminal, and having a gate coupled to the drain of the cascode transistor; and a third transistor having a source to drain path coupling the source to drain path of the first transistor to the second voltage potential terminal, and having a gate coupled to the gate of the second transistor.

3. The power converter of claim 2, further comprising:

a fourth transistor having a source to drain path coupled on a first end to the drain of the first cascode transistor and to the gate of the second transistor, and on a second end to the source to drain path of the second transistor, and having a gate coupled to the output of the operational amplifier.

4. The power converter of claim 2, further comprising:

a fourth transistor having a source to drain path coupling the drain of the first cascode transistor to the second voltage potential terminal, and having a gate coupled to a voltage reference.

5. The power converter of claim 3, further comprising:

a fifth transistor having a source to drain path coupling the second end of the source to drain path of the fourth transistor to the second voltage potential terminal, and having a gate coupled to a voltage reference.

6. The power converter of claim 1, further comprising:

a second transistor having a source to drain path coupling the drain of the first cascode transistor to the first voltage potential terminal, and a gate coupled to the output of the operational amplifier.

7. The power converter of claim 1, further comprising:

a second cascode transistor having a source coupled to the output node, a drain coupled to the second voltage potential terminal, and a gate coupled to the gate of the first cascode transistor, the second cascode transistor having a smaller channel width than the first cascode transistor.

8. The power converter of claim 7, further comprising:

a capacitor having a first terminal coupled to the gates of the first and second cascode transistors, and having a second terminal coupled to the second voltage potential terminal; and a depletion mode transistor having a source to drain path coupling the drain of the second cascode transistor to the first terminal of the capacitor, and having a gate coupled to the output node.

9. The power converter of claim 8, further comprising:

a second transistor having a source to drain path coupling the drain of the second cascode transistor to the second voltage potential terminal, and having a gate coupled to a voltage reference.

10. The power converter of claim 1, further comprising:

a second cascode transistor having a source coupled to the output node, a drain coupled to the second voltage potential terminal, and a gate coupled to the gate of the first cascode transistor, the second cascode transistor having a smaller channel width than the first cascode transistor;

a second transistor having a source to drain path coupling the drain of the first cascode transistor to the second voltage potential terminal, and having a gate coupled to the drain of the cascode transistor;

a third transistor having a source to drain path coupling the source to drain path of the first transistor to the second voltage potential terminal, and having a gate coupled to the gate of the second transistor;

a capacitor having a first terminal coupled to the gates of the first and second cascode transistors, and having a second terminal coupled to the second voltage potential terminal; and a depletion mode transistor having a source to drain path coupling the drain of the second cascode transistor to the first terminal of the capacitor, and having a gate coupled to the output node.

11. The power converter of claim 10, further comprising:

a fourth transistor having a source to drain path coupled on a first end to the drain of the first cascode transistor and to the gate of the second transistor, and on a second end to the source to drain path of the second transistor, and having a gate coupled to the output of the operational amplifier.

12. The power converter of claim 11, further comprising:

a fifth transistor having a source to drain path coupling the second end of the source to drain path of the fourth transistor to the second voltage potential terminal, and having a gate coupled to a voltage reference; and a sixth transistor having a source to drain path coupling the drain of the second cascode transistor to the second voltage potential terminal, and having a gate coupled to a voltage reference.

13. The power converter of claim 12, wherein the first, second, third, fourth and fifth transistors are NMOS transistors, and the first and second cascode transistors are PMOS transistors.

14. The power converter of claim 13, further comprising:

an additional capacitor coupling the gate of the first transistor to the second voltage potential terminal.

15. The power converter of claim 14, wherein the second voltage potential terminal is coupled to ground.

16. The power converter of claim 15, wherein the first voltage potential terminal is coupled to approximately 3.3 volts.

17. The power converter of claim 1 further comprising:

a capacitor coupling the output node to the second input of the operational amplifier.

* * * * *